(12) United States Patent
Kim

(10) Patent No.: US 7,611,921 B2
(45) Date of Patent: *Nov. 3, 2009

(54) METHOD FOR MANUFACTURING CMOS IMAGE SENSOR WHICH IMPROVES SENSITIVITY BY REMOVING A PASSIVATION MEMBRANE IN A PIXEL REGION OF THE CMOS IMAGE SENSOR

(75) Inventor: Jin Han Kim, Icheon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/644,221

(22) Filed: Dec. 21, 2006

(65) Prior Publication Data

US 2007/0148805 A1 Jun. 28, 2007

(30) Foreign Application Priority Data

Dec. 28, 2005 (KR) .................... 10-2005-0131435

(51) Int. Cl.
*H01L 21/00* (2006.01)
(52) U.S. Cl. .................. 438/70; 438/72; 257/294; 257/E27.133
(58) Field of Classification Search ............... 438/26, 438/28, 29, 70, 71, 72; 257/89, 290, 291, 257/294, E27.133, E37.121, E33.073
See application file for complete search history.

(56) References Cited

U.S. PATENT DOCUMENTS 5,451,293 A 9/1995 Tabara 5,483,096 A 1/1996 Kuhara
6,107,191 A 8/2000 Han (Continued)

FOREIGN PATENT DOCUMENTS

KR 10-2005-0011951 A 1/2005

(Continued)

OTHER PUBLICATIONS

Office Action; Chinese Patent Application No. 2006101701803; Dated: May 9, 2008; People's Republic of China.

(Continued)

*Primary Examiner*—Khiem D Nguyen
(74) *Attorney, Agent, or Firm*—The Law Offices of Andrew D. Fortney; Andrew D. Fortney

(57) ABSTRACT

A method for manufacturing a CMOS image sensor is disclosed. The method includes the steps of: forming a passivation oxide and a passivation nitride after forming a pad; performing a hydrogen anneal; selectively removing the passivation nitride and cleaning the passivation oxide; opening and cleaning the pad by removing the passivation oxide from the pad region; forming a pad protection membrane; forming color filter array, planarization layer and a plurality of microlenses; and removing the pad protection membrane from the pad region. A circle defect in a pixel region may be removed according to the disclosed method for manufacturing the CMOS image sensor. Accordingly, the sensitivity of the CMOS image sensor may be increased by raising the quality of the CMOS image sensor and reducing reflectance of the light.

18 Claims, 6 Drawing Sheets

U.S. PATENT DOCUMENTS

| | | | |
|---|---|---|---|
| 6,127,715 | A | 10/2000 | Yamamoto et al. |
| 6,188,092 | B1 * | 2/2001 | Hatano et al. ............... 257/229 |
| 6,369,417 | B1 * | 4/2002 | Lee ........................ 257/294 |
| 6,582,988 | B1 * | 6/2003 | Hsiao et al. .................. 438/70 |
| 6,617,189 | B1 * | 9/2003 | Chen et al. ................... 438/48 |
| 6,794,215 | B2 * | 9/2004 | Park et al. .................... 438/69 |
| 6,803,250 | B1 | 10/2004 | Yaung et al. |
| 7,193,289 | B2 * | 3/2007 | Adkisson et al. ............. 257/431 |
| 7,268,009 | B2 | 9/2007 | Hwang |
| 2006/0046341 | A1 | 3/2006 | Joon |

FOREIGN PATENT DOCUMENTS

| | | |
|---|---|---|
| KR | 10-2005-0011955 A | 1/2005 |
| KR | 10-0504563 B1 | 7/2005 |
| KR | 10-2005-0079495 A | 8/2005 |
| TW | 525223 | 3/2003 |

OTHER PUBLICATIONS

Joon Hwang; Method of Manufacturing Image Sensor Using Barrier Layer for Restraining Generation of Metal Pad Particles; Publication No. 100504563 B1; Publication Date: Jul. 21, 2005; English Abstract of Korean Intellectual Property Office; Republic of Korea.

Eun Mi Huh; Method for Manufacturing CMOS Image Sensor Capable of Protecting Lifting of Microlens Capping Layer; Publication No. 1020050011955 A; Publication Date: Jan. 31, 2005; English Abstract of Korean Intellectual Property Office; Republic of Korea.

Sung-Shiung Wang and Jian-Luen Yang; Method for Removing Photoresist and Residual Polymer from Polysilicon Gate; English Abstract of Taiwan Publication No. TW525223B; Publication Date: Mar. 21, 2003; esp@cenet database—Worldwide.

Jung Hyun Cho; "Method of Forming Pad of Image Device Capable of Preventing Pad Discolor"; Korean Patent Publication No. 1020050079495 A; Publication Date: Aug. 10, 2005; Korean Intellectual Property Office; Republic of Korea.

Joon Hwang; "Method of Manufacturing Image Sensor Using Barrier Layer for Restraining Generation of Metal Pad Particles"; Korean Patent Abstracts; Publication No. 100504563 B1; Publication Date: Jul. 21, 2005; Korean Intellectual Property Office, Republic of Korea.

Eun Mi Huh; "Method for Manufacturing CMOS Image Sensor Capable of Protecting Lifting of Microlens Capping Layer"; Korean Patent Abstracts; Publication No. 1020050011955 A; Publication Date: Jan. 31, 2005; Korean Intellectual Property Office, Republic of Korea.

Eun Mi Huh; "Method for Manufacturing CMOS Image Sensor Capable of Protecting Lifting of Microlens Capping Layer"; Korean Patent Abstracts; Publication No. 1020050011951 A; Publication Date: Jan. 31, 2005; Korean Intellectual Property Office, Republic of Korea.

Sung-Shiung Wang and Jian-Luen Yang; "Method for Removing Photoresist and Residual Polymer from Polysilicon Gate"; esp@cenet; Taiwanese Publication No. TW525223 B; Publication Date: Mar. 21, 2003; esp@cenet Database—Worldwide, http://v3.espacenet.com/publicationDetails/biblio?KC=B&date=. . . .

* cited by examiner

METHOD FOR MANUFACTURING CMOS IMAGE SENSOR WHICH IMPROVES SENSITIVITY BY REMOVING A PASSIVATION MEMBRANE IN A PIXEL REGION OF THE CMOS IMAGE SENSOR

BACKGROUND OF THE INVENTION

1. Field of the Invention

The present invention relates to a method for manufacturing a CMOS image sensor, and more particularly, to post-processing of a pad that includes a metal interconnection layer.

2. Description of the Related Art

The characteristics of the CMOS image sensor depend on the sensitivity of a photo diode receiving an external photo particle. This sensitivity depends largely on a distance and membrane characteristics between a microlens and a photo diode in alignment therewith.

However, a passivation nitride of a conventional pixel block does not reflect a light as much as a metal layer, but it blocks and reflects a relatively large part of the light that would otherwise pass to a passivation oxide. Accordingly, the sensitivity of the CMOS image sensor may deteriorate.

Meanwhile, in the case of the CMOS image sensor generally, a hydrogen anneal process for improving the low illumination characteristics (which differs from a general semiconductor manufacturing process) is performed not after laminating the passivation oxide, but after laminating the passivation nitride for further improving the low illumination characteristics. This raises various potential problems in the wafer edge region, related to a weak passivation oxide and an interlayer stress.

Hereinafter, referring to FIGS. 1a to 1h, a method for manufacturing a conventional CMOS image sensor (and problem[s] thereof) is described as below. In particular, FIGS. 1a to 1h represent processes from the step of forming microlenses to the step of opening a pad (after forming the pad).

Firstly, in FIG. 1a, after a pad 110 is formed, a passivation oxide and a passivation nitride are formed. On the other hand, in a wafer edge region, a wafer edge remaining membrane 100 of non-uniform state exists. The wafer edge membrane 100 is typically generated from a wafer edge treatment (e.g., through photolithographic processes) that differs from the same processes (at least in results) in the main chip region (e.g., the inner region of the wafer. Since the wafer edge membrane 100 is formed non-uniformly, the wafer edge region may have little or no adhesive strength.

As shown in FIG. 1b, in the case of the CMOS image sensor, a hydrogen anneal is performed, which comprises a thermal reflow using a gas mixture which typically includes hydrogen gas and nitrogen gas, in a proper or predetermined ratio.

In the thermal reflow, the interlayer stress of the passivation nitride 130 on the wafer edge area 100 may deteriorate, which can result in wafer edge peeling 140, which the passivation nitride 130 on the wafer edge can float in a circular shape and be raised since a fluorine ion in a fluorinated silicate glass (FSG) at the wafer edge membrane 100 may also "float."

Moreover, in the thermal reflow, a peeling defect from the wafer edge can transition to a pixel region in the inner region of the wafer (e.g., that part of the wafer other than the outer 0.1-0.5 mm edge of the wafer). A circle defect 145 denotes a particle transferred to the inner region of the wafer.

As shown in FIG. 1c, the pad region 110 is opened through photolithography and etching processes after scrubbing in order to remove the circle defect 145. Cleaning and pad treatment processes, which include a pad ashing step, a solvent cleaning step, and a final cure step, are also performed.

Although the scrubbing process is performed to remove the circle defect 140, there is the circle defect 145 which is still not removed.

As shown in FIG. 1d, a pad protection membrane 150 is formed. The pad protection membrane 150 is a plasma enhanced tetraethyl orthosilicate (PETEOS) membrane or a thermosetting resin membrane, and may have a depth of 200 to 600 Å so that the pad 110 is opened easily.

FIG. 1e shows a color filter array 160 formed by one or more color filter photolithography processes.

FIG. 1f shows a planarization layer 170 formed by deposition of a planarization material, then patterning by a planarization layer photolithography process, and FIG. 1g shows a plurality of convex microlenses 180 formed by thermal reflow.

Finally, FIG. 1h shows an open pad 110, formed by etching the pad protection membrane 150 in the pad regions. Subsequently, a probing test is capable of being performed.

SUMMARY OF THE INVENTION

It is, therefore, an object of the present invention to provide a method for manufacturing a CMOS image sensor which improves sensitivity by removing a passivation membrane in a pixel region of the CMOS image sensor, and improves a quality and a yield of the image sensor by removing a circle defect that may move from an edge region to the pixel region of a wafer.

In accordance with one aspect of the present invention to solve the problem, there is provided a method for manufacturing a CMOS image sensor, including the steps of: Forming a passivation oxide and a passivation nitride on a pad; performing a hydrogen anneal; removing and cleaning the passivation nitride and the passivation oxide selectively; opening and cleaning the pad by removing the passivation nitride and the passivation oxide over the pad region; forming a pad protection membrane; forming a color filter array, a planarization layer and a plurality of microlenses; and removing the pad protection membrane from the pad region.

It is preferred that the first cleaning step includes ashing and cleaning with a solvent. Moreover, it is preferred that the second cleaning step includes ashing, solvent cleaning and secondary ashing. And, it is preferred that the pad protection membrane comprises a plasma enhanced tetraethyl orthosilicate (PE TEOS) membrane or a thermosetting resin membrane. Moreover, it is preferred that the pad protection membrane has a thickness of 200 to 600 Å. And, it is preferred that the PE TEOS membrane is removed by dry etching. Moreover, it is preferred that the thermosetting resin membrane is removed by oxygen ashing.

DETAILED DESCRIPTION OF THE INVENTION

Hereinafter, an embodiment of the present invention is described in details with reference to FIGS. 2a to 2i.

FIGS. 2a to 2d are cross-sectional views illustrating post-processes performed after a pad 210 is formed.

Figure 1A:
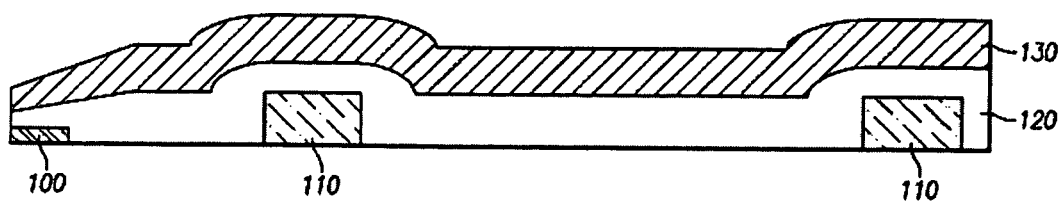
FIGS. 1a to 1h are cross-sectional views illustrating a conventional method for manufacturing a CMOS image sensor.
Figure 1B:
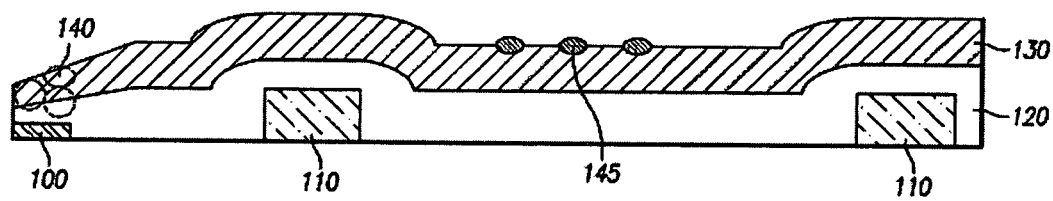
Figure 1C:
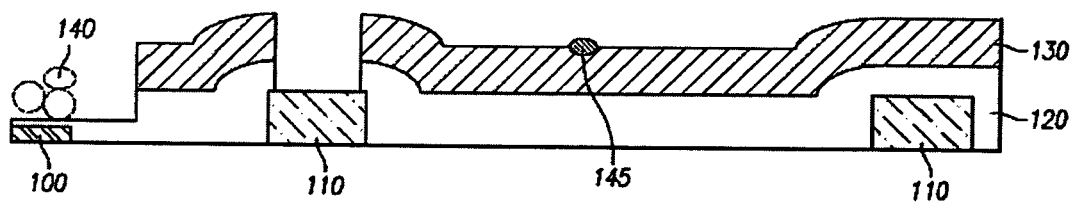
Figure 1D:
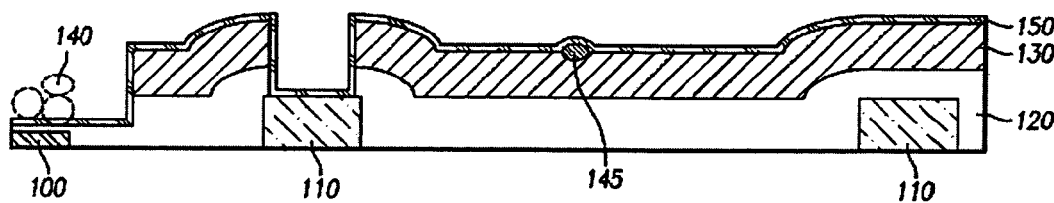
Figure 1E:
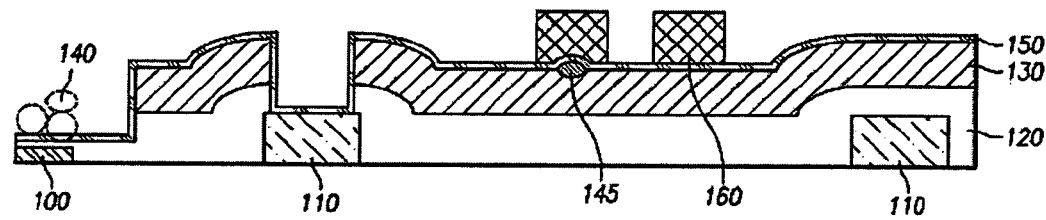
Figure 1F:
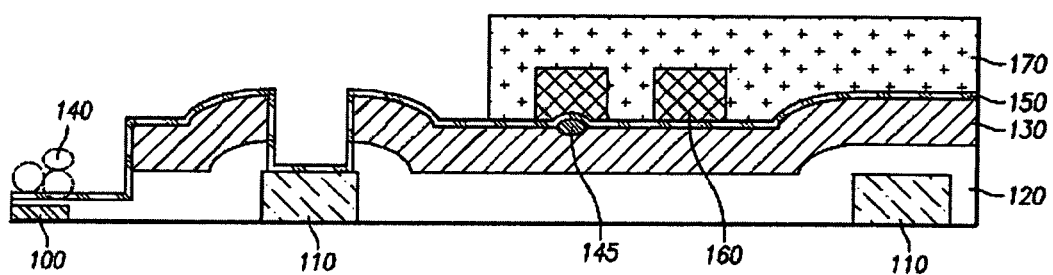
Figure 1G:
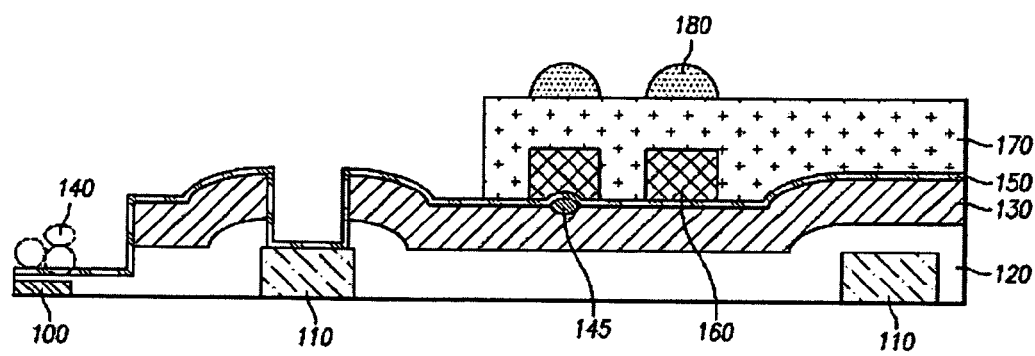
Figure 1H:
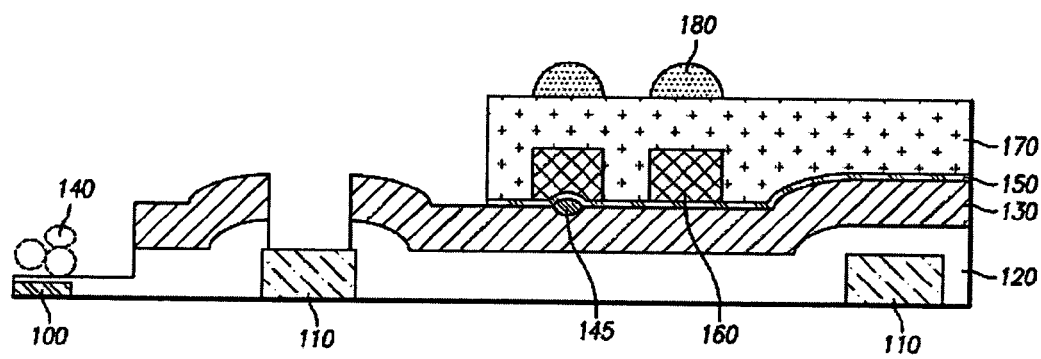
Figure 2A:
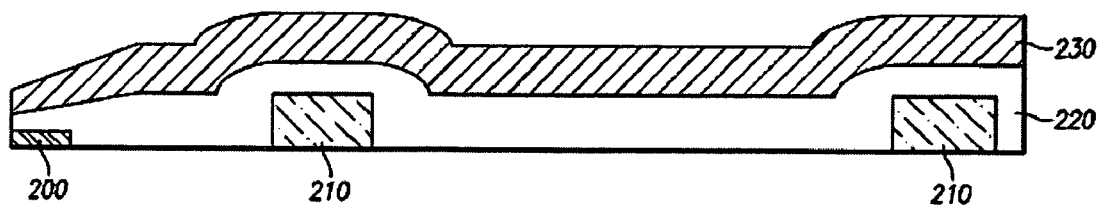
FIGS. 2a to 2i are cross-section views illustrating a method for manufacturing a CMOS image sensor in accordance with an embodiment of the present invention.

As shown in FIG. 2a, after the pad 210 is formed, a passivation oxide 220 and a passivation nitride 230 are sequentially formed. After the passivation oxide 220 is formed, a planarization process may be performed, and then the passivation nitride 230 may be formed.

On the other hand, in a wafer edge region, a wafer edge membrane 200 of non-uniform state, which is typically generated from a difference in results of photolithographic and/or etching processes at the wafer edge, as compared to the inner region of the wafer. Since the wafer edge membrane 200 is formed non-uniformly, the wafer edge region may have little or no adhesive strength.

Figure 2B:
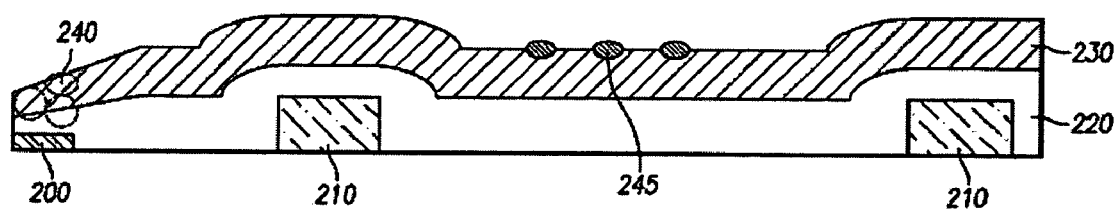

As shown in FIG. 2b, in the case of the CMOS image sensor, a hydrogen anneal is performed. The hydrogen anneal may comprise a thermal reflow using a gas mixture which includes hydrogen gas ($H_2$) and nitrogen gas ($N_2$) in a proper or predetermined ratio. Alternatively, the annealing gas may comprise a reducing gas, such as a silane (e.g., $SiH_4$) or ammonia ($NH_3$), and/or a noble gas such as He, Ne, Ar, Kr, etc.

In the thermal reflow, the interlayer stress of the passivation nitride 230 on the wafer edge region 200 may deteriorate, or a wafer edge peeling 240, in which the passivation nitride 230 on the wafer edge may "float" in a circular shape or otherwise form particles that can move or migrate to an interior region of the wafer, may occur since fluorine in a fluorinated silicate glass (FSG) at the wafer edge membrane 200 may also "float." Moreover, in the thermal reflow, a peeling defect from the wafer edge may transition, move or migrate to a pixel region in the inner region 10 of the wafer, which can generate a circle defect 245.

Figure 2C:
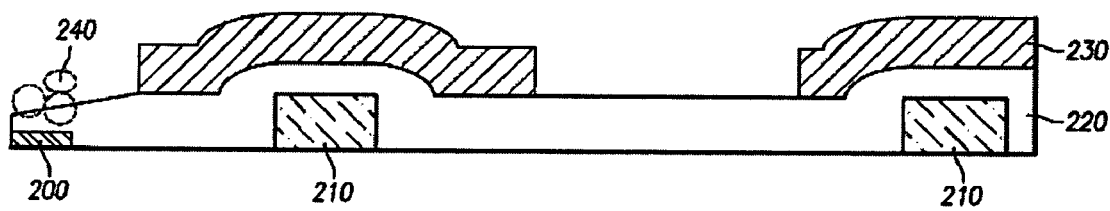

FIG. 2c shows a patterned passivation nitride 230 in a pixel region of the wafer. The passivation nitride 230 is generally patterned by photolithographic and etching processes. The patterning is also performed on or over the edge region 200. That is, in the present invention, the passivation nitride 230 in an image signal processor (ISP) logic block in a main chip or inner region of the wafer (e.g., in regions surrounding the pads 210) and in the pad region of the wafer edge 200 is not etched, and the passivation nitride 230 in pixel region is removed. Accordingly, the quality of the CMOS image sensor is increased by removing at least some of the circle defects 245 on the passivation nitride 230 in the pixel region.

Moreover, the sensitivity of the CMOS image sensor may further increase by removing the passivation nitride 230 (having relatively larger reflective index to light than the passivation oxide 220) in the pixel region.

After a selective etching process of the passivation nitride, the ashing and solvent cleaning steps are performed in a subsequent first cleaning process.

Figure 2D:
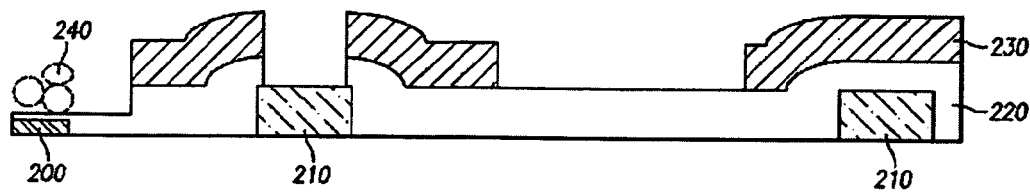

As shown in FIG. 2d, after the passivation nitride 230 and the passivation oxide 220 in a first pad region are etched by the photo and etching processes, a subsequent first ashing, solvent cleaning, and second ashing included in a second cleaning process are sequentially performed.

Since the pad may be opened in the second cleaning process, the pad 210 is cleaned more, and pad corrosion may be prevented by performing the second ashing.

Figure 2E:
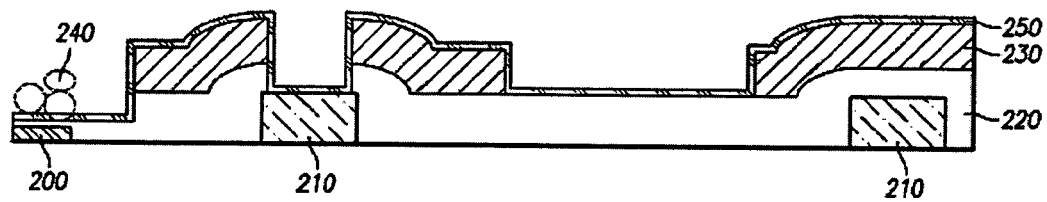
Figure 2F:
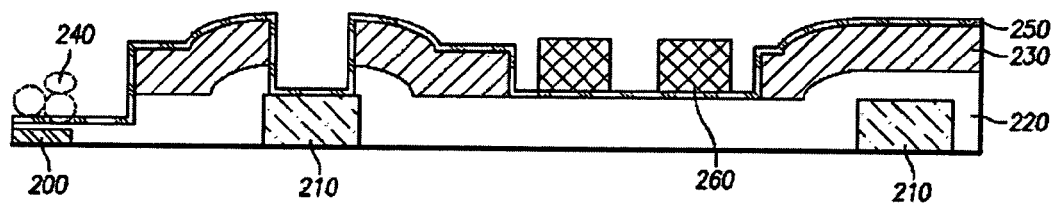
Figure 2G:
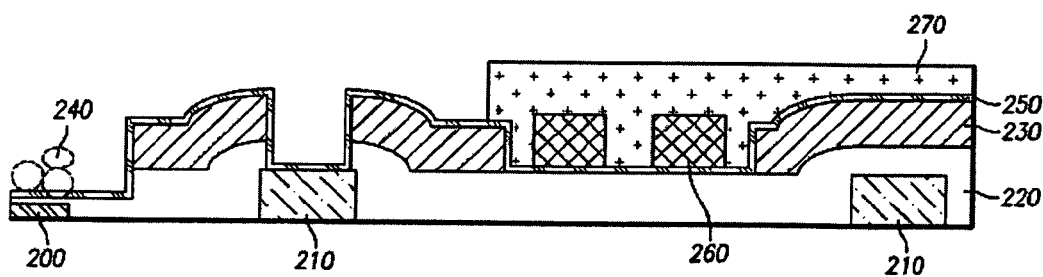
Figure 2H:
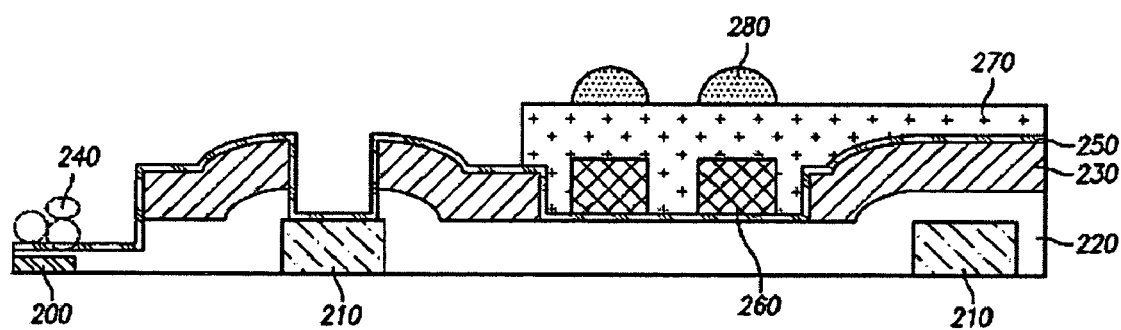
Figure 2I:
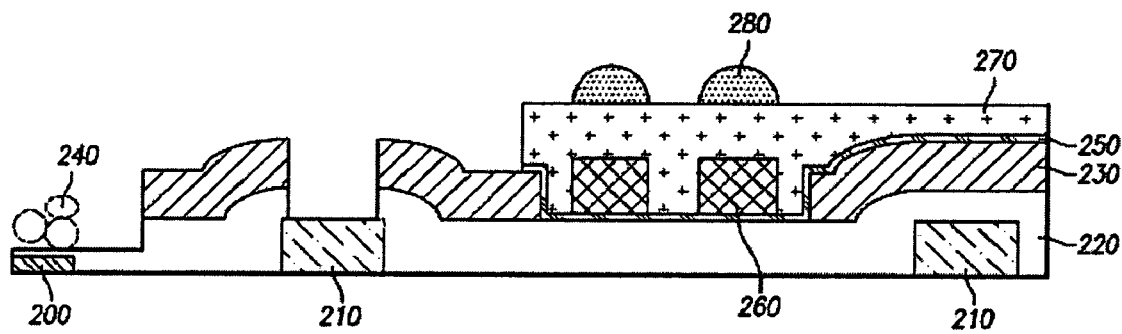

Subsequently, as shown in FIG. 2e, a pad protection membrane 250 is formed on a whole substrate. It is preferred that the pad protection membrane 250 comprises a plasma enhanced tetraethyl orthosilicate (PETEOS) membrane or a thermosetting resin membrane.

The pad protection membrane (250) may have a thickness of 200 to 600 Å, so that the pad protection membrane 250 is removed easily from the pad region after the microlens forming process.

Subsequently, a color filter array 260 is formed on a pixel region by a color filter photolithography process (FIG. 2f), and a planarization layer 270 is formed thereon by a deposition of a planarization layer and a subsequent photolithographic patterning process (FIG. 2g), and then convex microlenses 280 are formed by thermal reflow (FIG. 2h) after a microlens deposition (e.g., including a conventional photoresist used for such purpose) and photolithography process is performed.

Finally, the pad 210 is opened by removing the (exposed) pad protection membrane 250.

In the case that the pad protection membrane 250 comprises the PE TEOS membrane, the pad protection membrane 250 can be removed by dry etching, and in the case that the pad protection membrane 250 comprises the thermosetting resin membrane, the pad protection membrane 250 can be removed by oxygen ashing.

In a method for manufacturing the CMOS image sensor according to the present invention, the quality of the CMOS image sensor is raised and the reflectance of the light in the CMOS image sensor is diminished, and the sensitivity of the CMOS image sensor is increased by removing circle defects in the pixel region at the same time by etching the passivation nitride in the pixel region.

While the present invention has been described with respect to certain preferred embodiments, it will be apparent to those skilled in the art that various changes and modifications may be made without departing from the spirits of the present invention and scope of the invention as defined in the following claims.

Therefore, the embodiment of the present invention is considered in not a limitative view but a descriptive view, and the scope of the present invention is defined in the following claims, and all differences within the equivalent range to the claims are included in the present invention.

What is claimed is:

1. A method for manufacturing a CMOS image sensor, comprising:
    forming a passivation oxide and a passivation nitride after forming a pad;
    performing a hydrogen anneal;
    selectively removing the passivation nitride directly over a pixel region of the CMOS image sensor and cleaning the passivation oxide by ashing, then cleaning with a solvent;
    opening and cleaning the pad by removing the passivation oxide over the pad, wherein the step of cleaning the pad further includes the steps of ashing, solvent cleaning and secondary ashing;
    forming a pad protection membrane;
    forming a color filter array, a planarization layer and a plurality of microlenses; and
    removing the pad protection membrane.

2. The method as recited in claim 1, wherein the pad protection membrane comprises a plasma enhanced tetraethyl orthosilicate (PE TEOS) membrane or a thermosetting resin membrane.

3. The method as recited in claim 2, wherein the pad protection membrane has a thickness of 200 to 600 Å.

4. The method as recited in claim 2, wherein the pad protection membrane comprises the PE TEOS membrane, and removing the PE TEOS membrane comprises dry etching.

5. The method as recited in claim 2, wherein the pad protection membrane comprises the thermosetting resin membrane, and removing the thermosetting resin comprises oxygen ashing.

6. The method of claim 1, wherein the step of performing the hydrogen anneal comprises a thermal reflow using a gas mixture including hydrogen gas and nitrogen gas.

7. The method of claim 1, wherein the step of performing the hydrogen anneal comprises a thermal reflow using a reducing gas selected from a group comprising silane and ammonia and/or a noble gas selected from a group comprising helium, neon, argon and kypton gas.

8. The method of claim 6, wherein the step of performing the hydrogen anneal comprises a thermal reflow using a gas mixture including hydrogen and nitrogen.

9. The method of claim 6, wherein the step of performing the hydrogen anneal comprises a thermal reflow using a reducing gas selected from a group comprising silane and ammonia and/or a noble gas selected from a group comprising helium, neon, argon and kypton.

10. The method as recited in claim 1, wherein the color filter array, the planarization layer and the plurality of microlenses are sequentially formed on a surface of the pad protection membrane over the pixel region of the CMOS image sensor before the pad protection membrane is removed to expose the pad.

11. A method for manufacturing a CMOS image sensor, comprising:
    forming a passivation oxide and a passivation nitride over a pad in the CMOS image sensor;
    selectively removing the passivation nitride directly over a pixel region of the CMOS image sensor and the pad and cleaning the passivation nitride and the passivation oxide by ashing, then cleaning with a solvent;
    opening the pad by removing the passivation oxide over the pad; cleaning the pad by ashing, solvent cleaning and secondary ashing;
    forming a pad protection membrane over an entire surface of the CMOS image sensor;
    forming a color filter array, a planarization layer and a plurality of microlenses on the CMOS image sensor; and
    removing an exposed portion the pad protection membrane.

12. The method of claim 11, further comprising performing a hydrogen anneal.

13. The method as recited in claim 11, wherein the pad protection membrane comprises a plasma enhanced tetraethyl orthosilicate (PE TEOS) membrane or a thermosetting resin membrane.

14. The method as recited in claim 13, wherein the pad protection membrane has a thickness of 200 to 600 Å.

15. The method as recited in claim 13, wherein the pad protection membrane comprises the PE TEOS membrane, and removing the PE TEOS membrane comprises dry etching.

16. The method as recited in claim 13, wherein the pad protection membrane comprises the thermosetting resin membrane, and removing the thermosetting resin comprises oxygen ashing.

17. The method as recited in claim 11, wherein the color filter array, the planarization layer and the plurality of microlenses are sequentially formed on a surface of the pad protection membrane over the pixel region of the CMOS image sensor before the exposed portion of the pad protection membrane is removed.

18. The method as recited in claim 11, further comprising cleaning the pad after the removal of the passivation oxide over the pad by a second ashing.

* * * * *